United States Patent
Kim et al.

(10) Patent No.: US 12,424,875 B2
(45) Date of Patent: Sep. 23, 2025

(54) WIRELESS CHARGING DEVICE AND MOBILE MEANS INCLUDING SAME

(71) Applicant: SKC CO., LTD., Gyeonggi-do (KR)

(72) Inventors: Nah Young Kim, Gyeonggi-do (KR); Seunghwan Lee, Gyeonggi-do (KR); Jong Hak Choi, Gyeonggi-do (KR); Tae Kyoung Kim, Gyeonggi-do (KR)

(73) Assignee: SKC CO., LTD., Gyeonggi-do (KR)

( * ) Notice: Subject to any disclaimer, the term of this patent is extended or adjusted under 35 U.S.C. 154(b) by 735 days.

(21) Appl. No.: 17/762,301

(22) PCT Filed: Oct. 6, 2020

(86) PCT No.: PCT/KR2020/013593
§ 371 (c)(1),
(2) Date: Mar. 21, 2022

(87) PCT Pub. No.: WO2021/071212
PCT Pub. Date: Apr. 15, 2021

(65) Prior Publication Data
US 2022/0416575 A1     Dec. 29, 2022

(30) Foreign Application Priority Data

Oct. 7, 2019  (KR) .................. 10-2019-0123801
May 7, 2020  (KR) .................. 10-2020-0054524

(51) Int. Cl.
*H02J 50/00*  (2016.01)
*B60L 53/12*  (2019.01)
(Continued)

(52) U.S. Cl.
CPC .......... *H02J 50/005* (2020.01); *B60L 53/12* (2019.02); *B60L 53/302* (2019.02); *H02J 50/10* (2016.02);
(Continued)

(58) Field of Classification Search
CPC .............................. H01F 27/025; H01F 27/10
(Continued)

(56) References Cited

U.S. PATENT DOCUMENTS 5,960,866 A * 10/1999 Kimura .............. F28D 15/0233
                                                            165/104.19
8,975,864 B2    3/2015 Kim
(Continued)

FOREIGN PATENT DOCUMENTS

DE     102017207266 A1    10/2018
DE     102018203557 A1     9/2019
(Continued)

OTHER PUBLICATIONS

"Copper", webpage https://en.wikipedia.org/wiki/Copper, Sep. 13, 2018, retrieved from Internet Archive Wayback Machine https://web.archive.org/web/20180913082630/https://en.wikipedia.org/wiki/Copper on Nov. 12, 2024 (Year: 2018).*
(Continued)

*Primary Examiner* — Edward Tso
*Assistant Examiner* — Ahmed H Omar
(74) *Attorney, Agent, or Firm* — IP & T GROUP LLP

(57) ABSTRACT

The present invention relates to a wireless charging device and a mobile means including same. Specifically, according to an embodiment of the present invention, a wireless charging device comprises: a coil unit, a magnetic unit arranged on the coil unit; and a heat transfer unit arranged in contact with at least a portion of the magnetic unit, thereby efficiently transferring heat generated in the magnetic unit to the outside and further improving heat dissipation and charging efficiency. Therefore, the wireless charging device can be advantageously used in a mobile means such as an electric vehicle requiring a large amount of power transmission between a transmitter and a receiver.

13 Claims, 16 Drawing Sheets

(51) Int. Cl.
　　　*B60L 53/302*　　　(2019.01)
　　　*H02J 50/10*　　　(2016.01)
　　　*H05K 7/20*　　　(2006.01)

(52) U.S. Cl.
　　　CPC ..... *H05K 7/20309* (2013.01); *H05K 7/20318* (2013.01)

(58) Field of Classification Search
　　　USPC ......................................................... 320/108
　　　See application file for complete search history.

(56) References Cited

U.S. PATENT DOCUMENTS

| | | | | |
|---|---|---|---|---|
| 2006/0157229 | A1* | 7/2006 | Hong | F28D 15/046 165/104.26 |
| 2018/0132376 | A1* | 5/2018 | Shin | H01F 27/366 |
| 2018/0198186 | A1* | 7/2018 | Hwang | H04B 5/77 |
| 2018/0254136 | A1* | 9/2018 | Ueda | H01F 27/28 |
| 2020/0198483 | A1 | 6/2020 | Laemmle et al. | |
| 2020/0381164 | A1* | 12/2020 | Ueda | H01F 27/025 |
| 2020/0403448 | A1* | 12/2020 | Laemmle | B60L 53/302 |

FOREIGN PATENT DOCUMENTS

| | | |
|---|---|---|
| JP | H10229611 A | 8/1998 |
| JP | 2009-018691 A | 1/2009 |
| JP | 2012-221572 A | 11/2012 |
| JP | 2019-145728 A | 8/2019 |
| KR | 10-2007-0080057 A | 8/2007 |
| KR | 10-2007-0104701 A | 10/2007 |
| KR | 10-2011-0042403 A | 4/2011 |
| KR | 10-2015-0090391 A | 8/2015 |
| KR | 10-2017-0032861 A | 3/2017 |
| KR | 10-1971884 B1 | 4/2019 |
| WO | 2009/116357 A1 | 9/2009 |

OTHER PUBLICATIONS

Office Action issued by the Korean Patent Office on Nov. 17, 2021.
Extended European Search Report for the European Patent Application No. 20873863.3 issued by the European Patent Office on Sep. 14, 2023.
Office Action for the Japanese Patent Application No. 2022-519378 issued by the Japanese Patent Office on Apr. 4, 2023.
Office Action for the Chinese Patent Application No. 202080070658.3 issued by the Chinese Patent Office on Nov. 28, 2023.

* cited by examiner

[Fig. 1A]
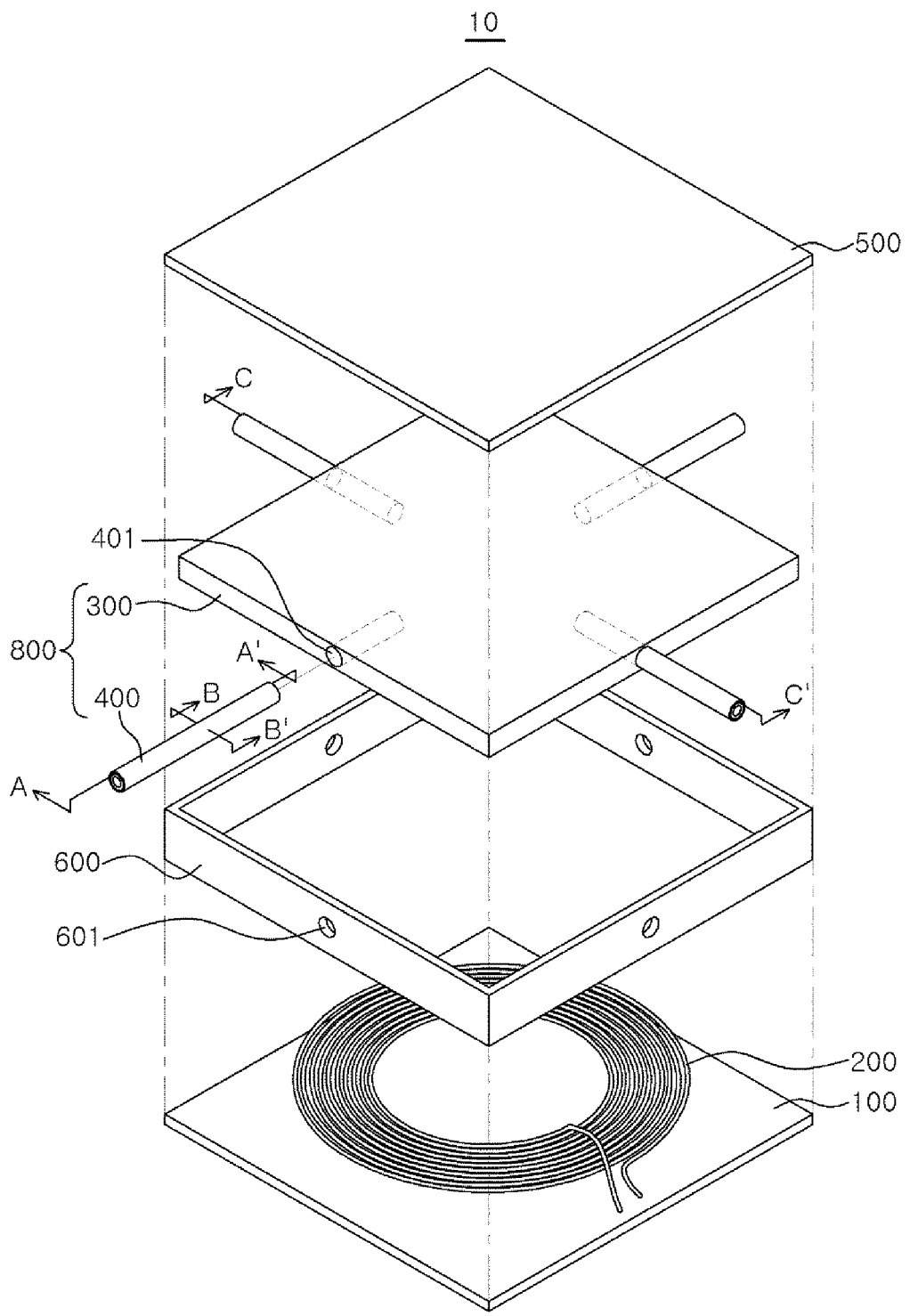

[Fig. 1B]
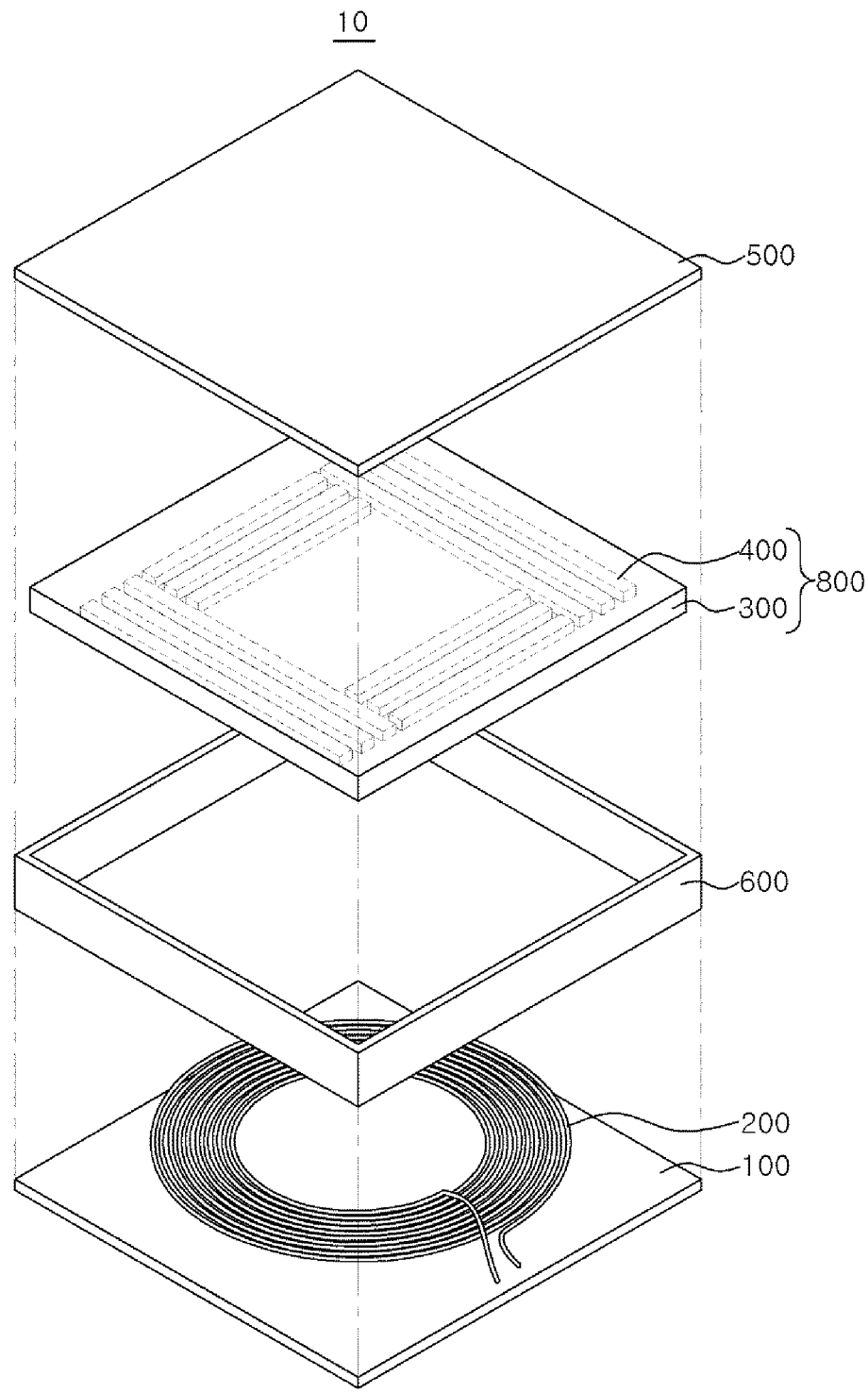

[Fig. 2A]
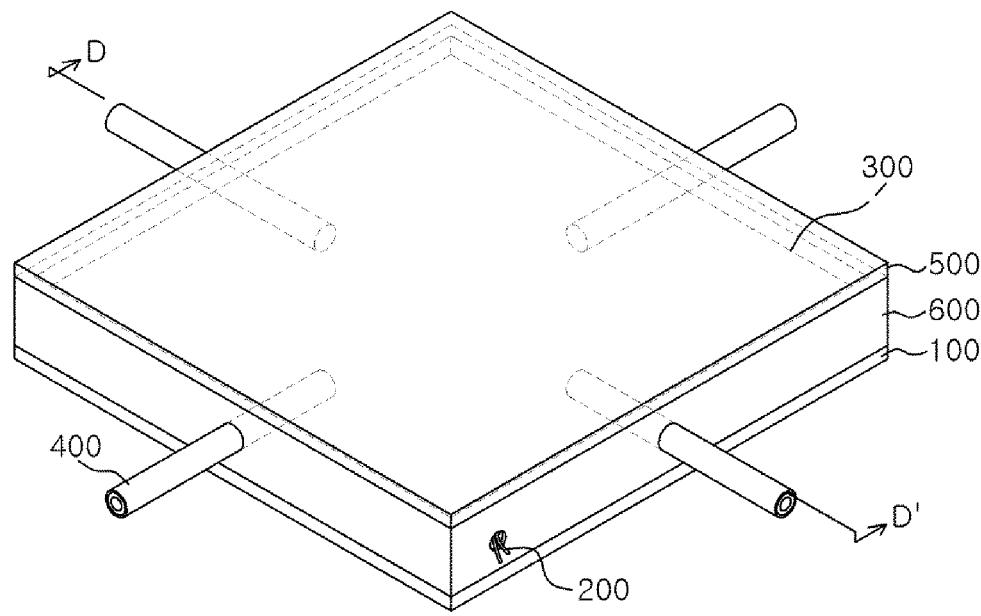
[Fig. 2B]
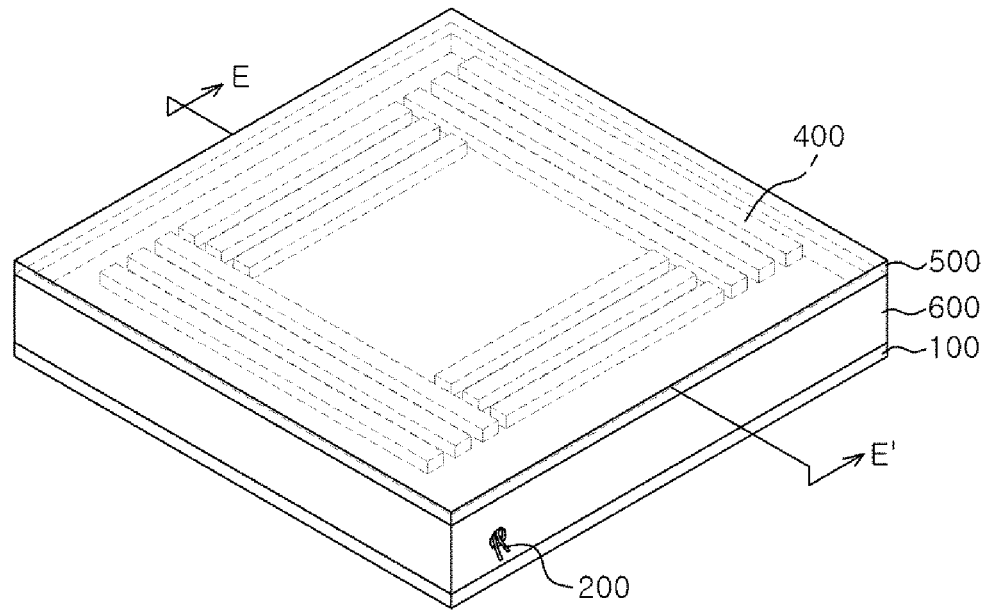

[Fig. 3A]
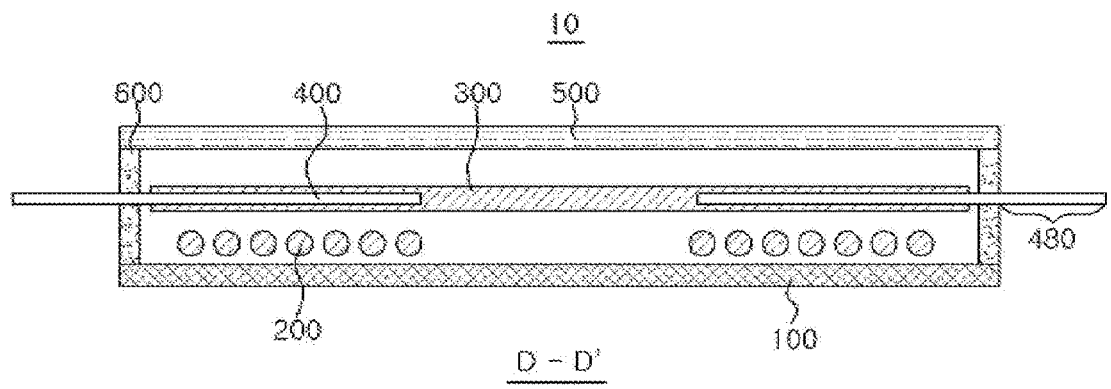
[Fig. 3B]
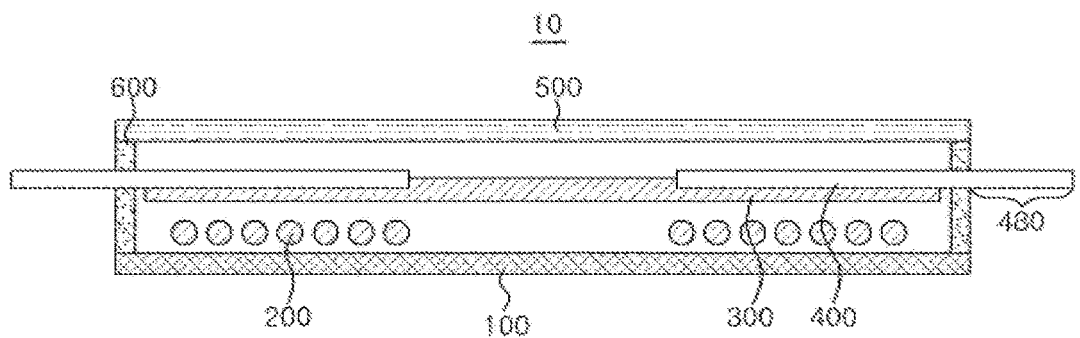

[Fig. 3C]
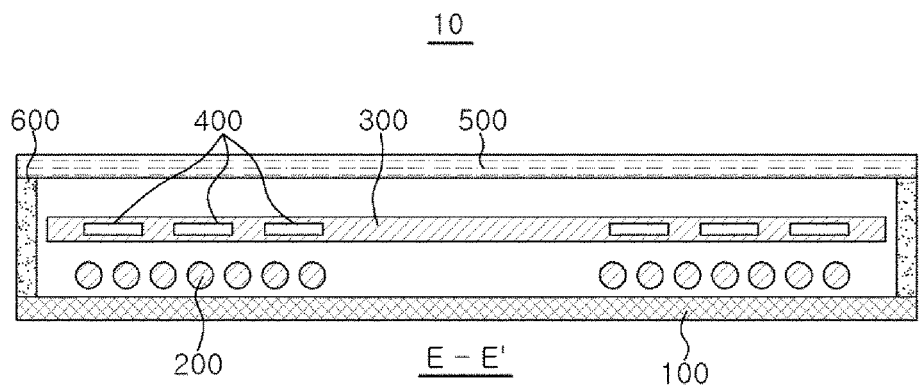
[Fig. 4A]
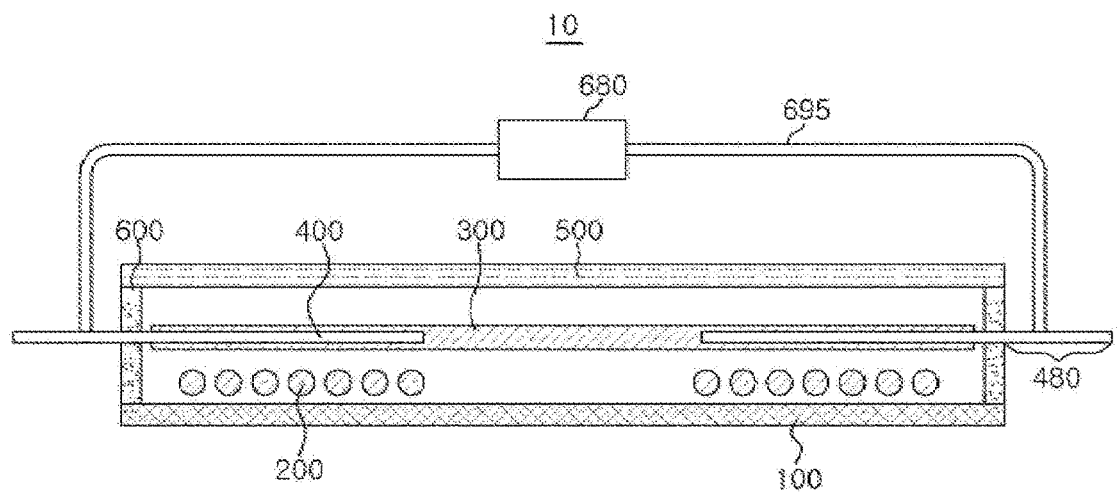

[Fig. 4B]
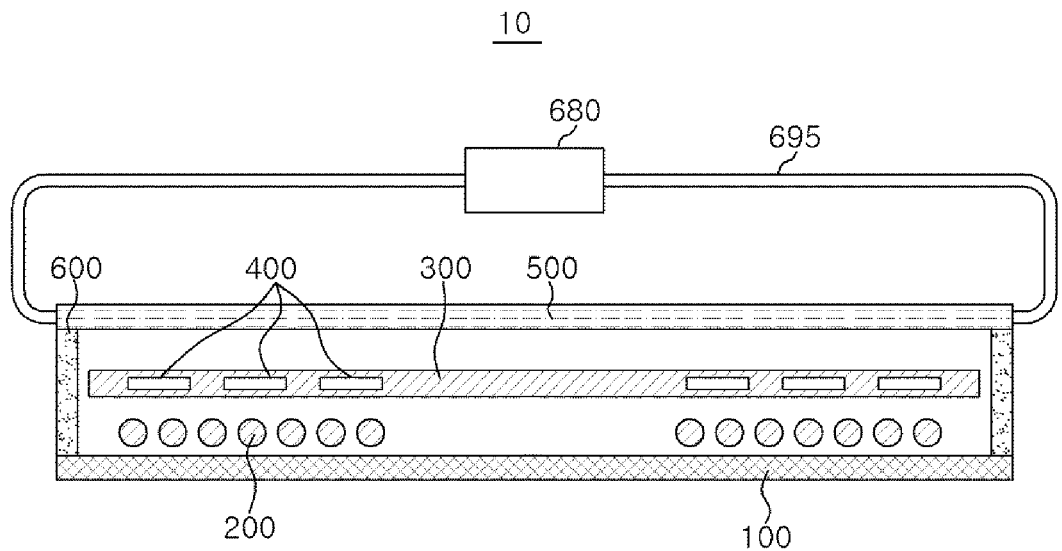
[Fig. 4C]
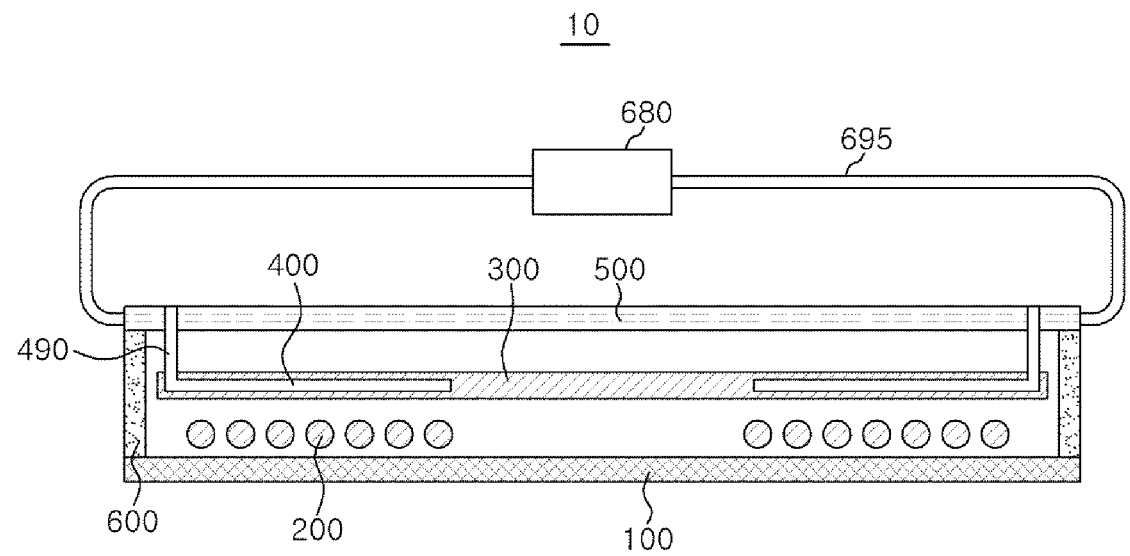

[Fig. 4D]
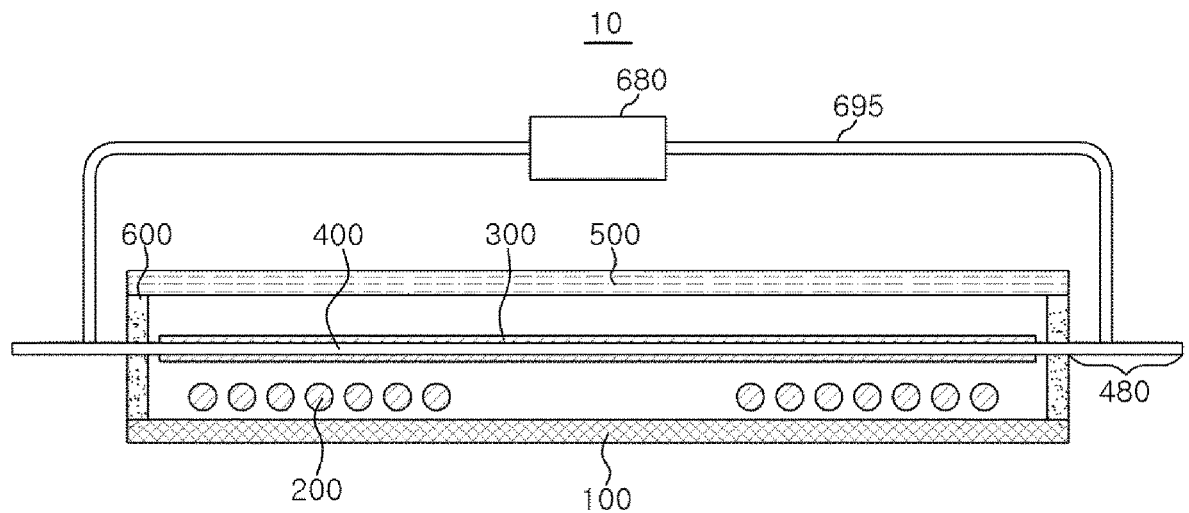
[Fig. 5]
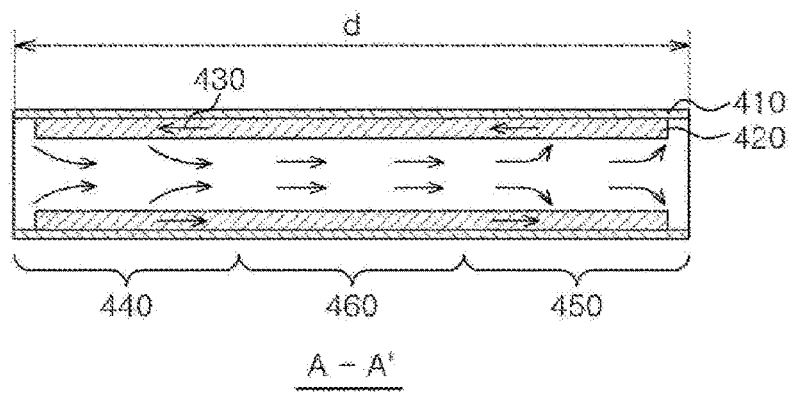

[Fig. 6]
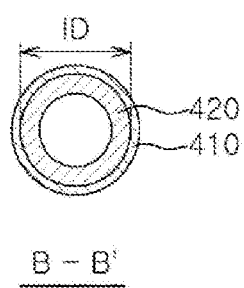
[Fig. 7]
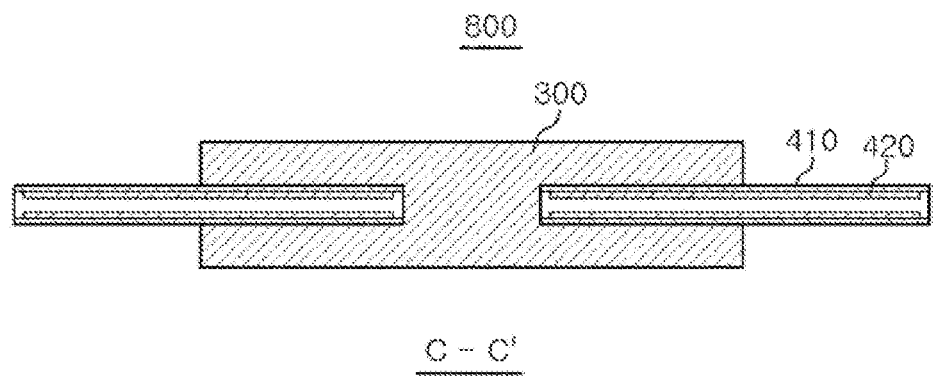

[Fig. 8A]
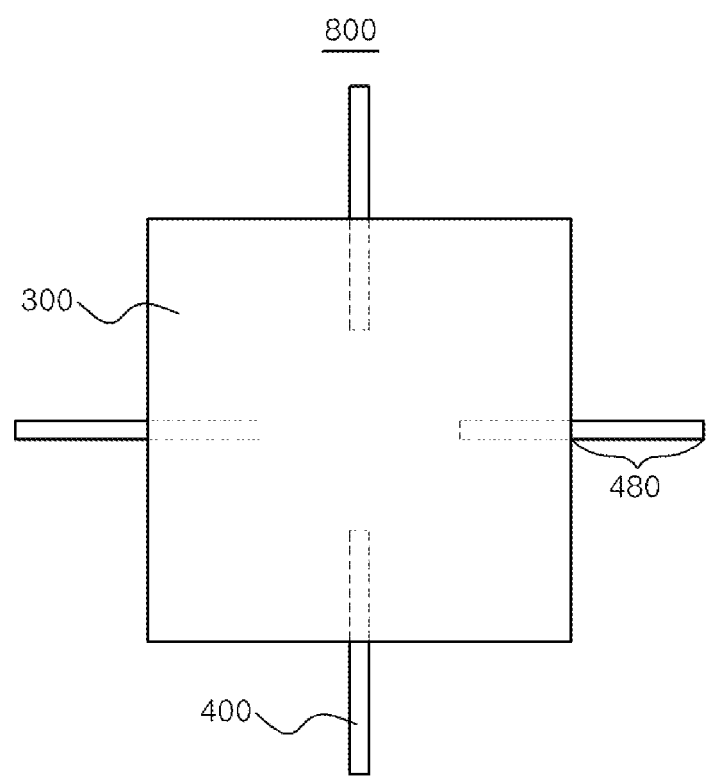

[Fig. 8B]
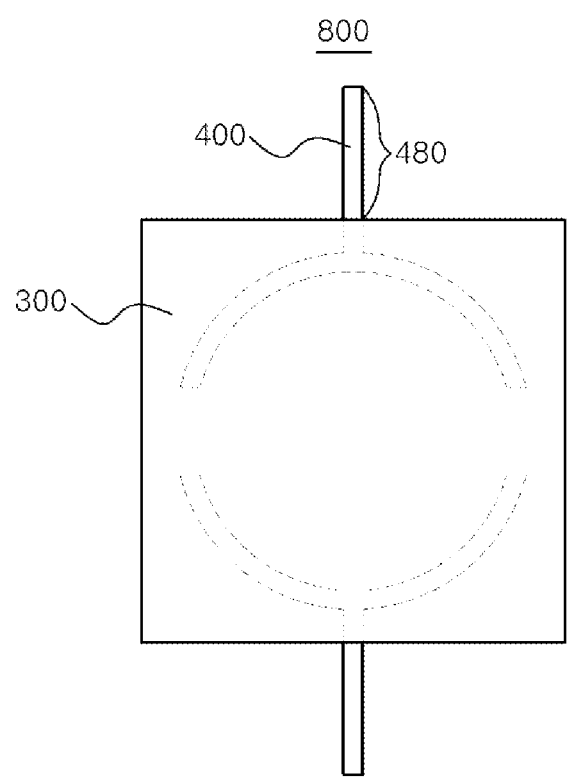

[Fig. 8C]
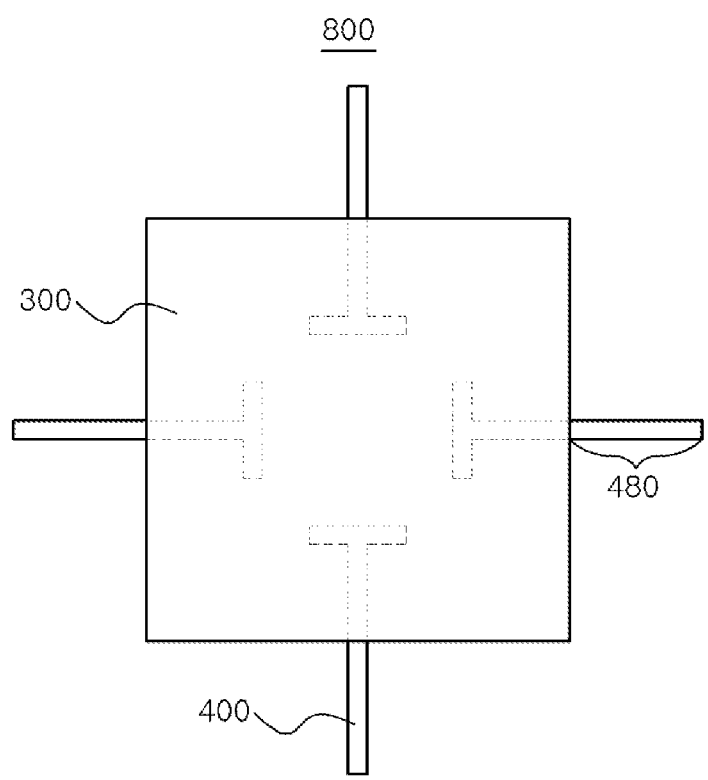

[Fig. 8D]
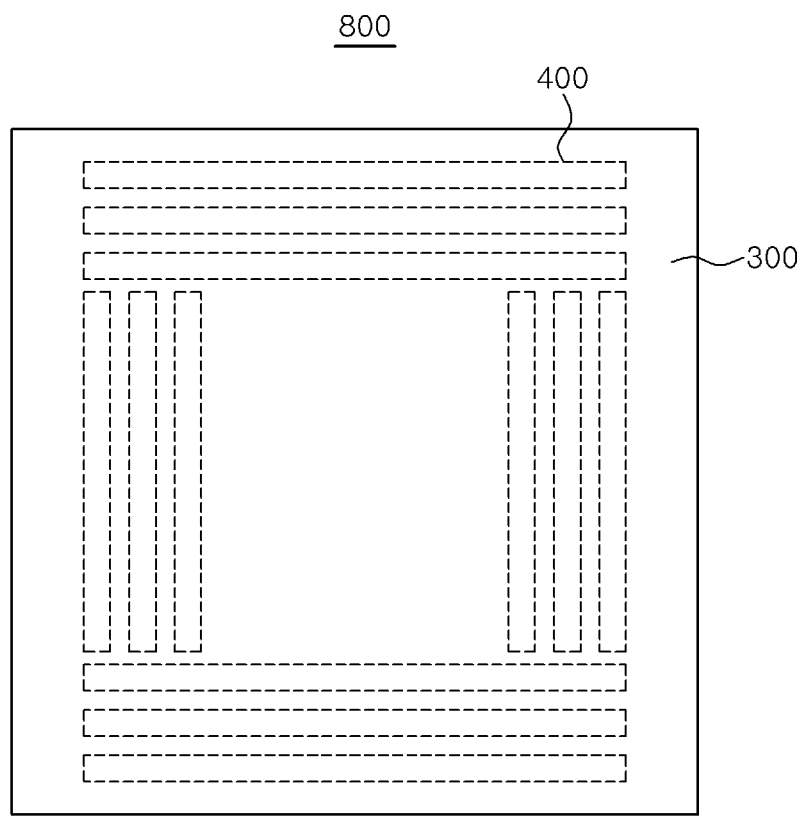

[Fig. 8E]
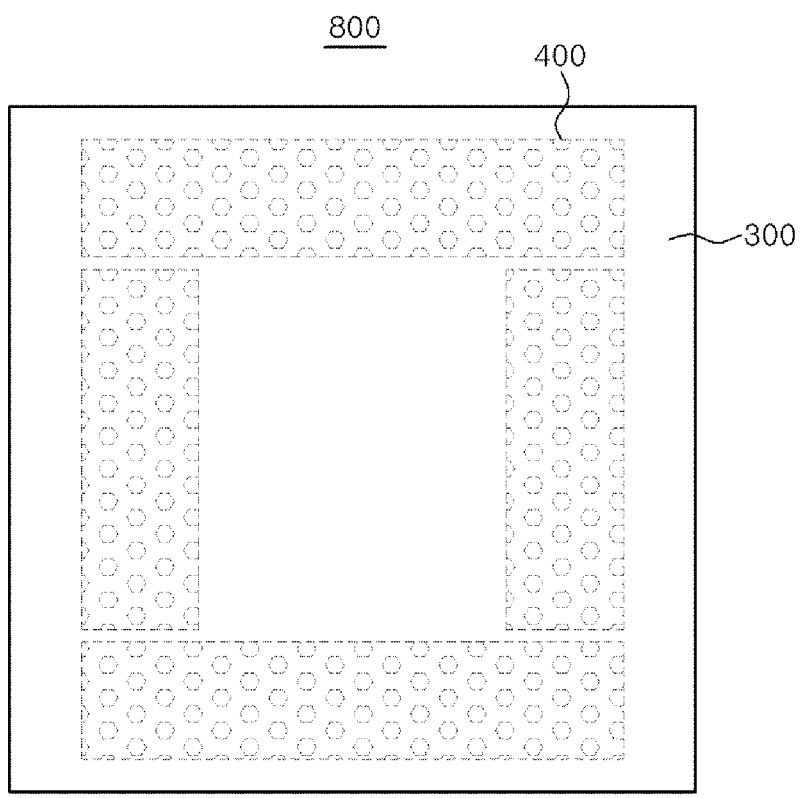

[Fig. 8F]
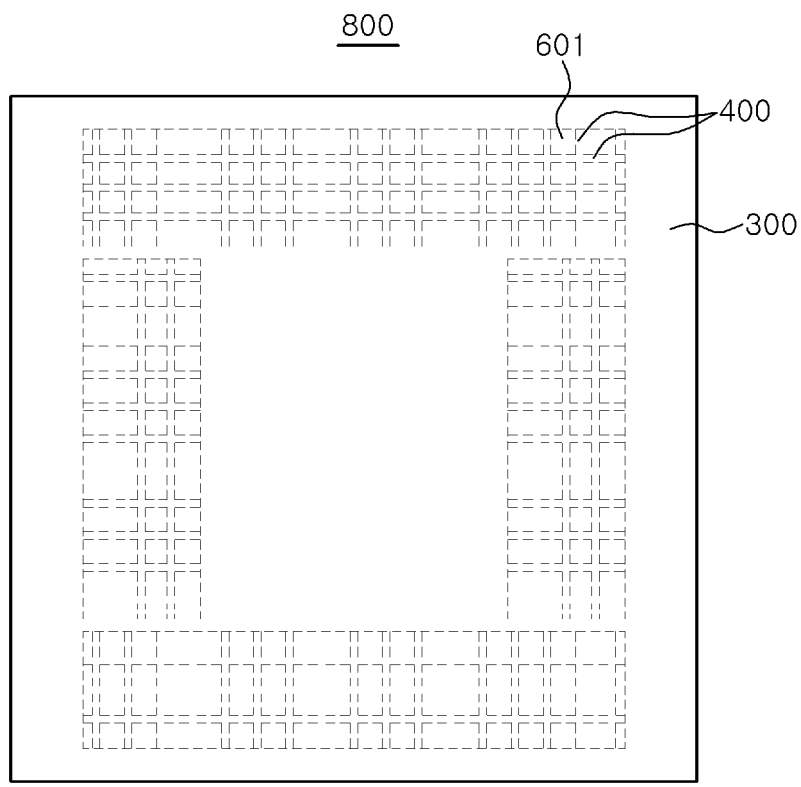

[Fig. 9]
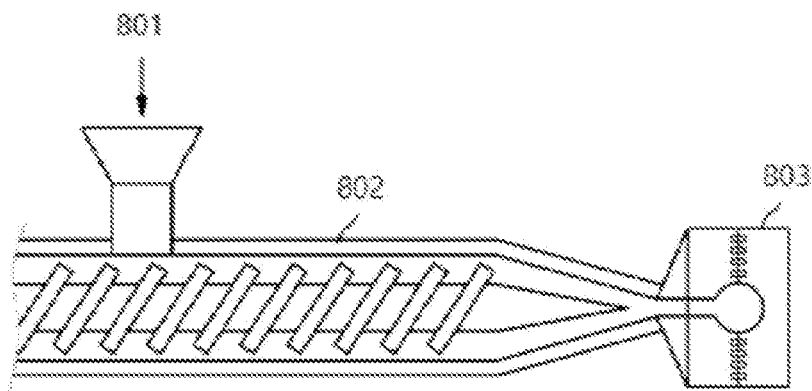
[Fig. 10]
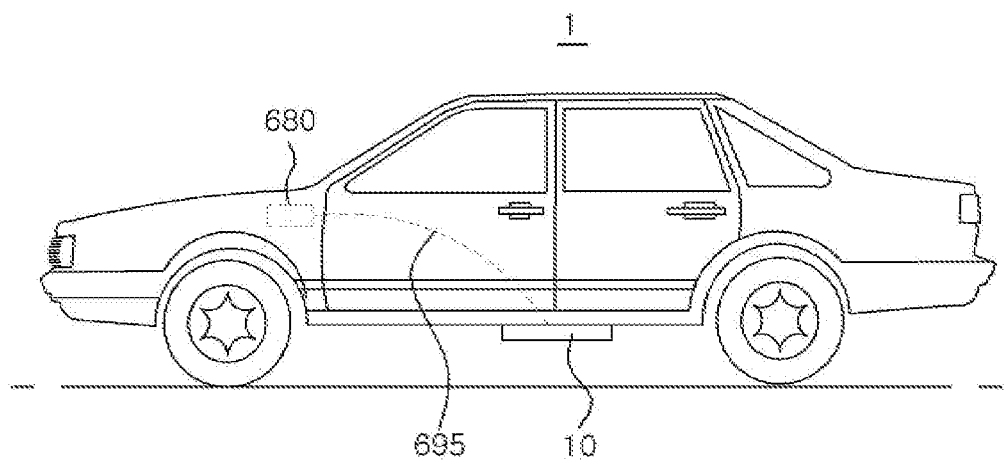

[Fig. 11]
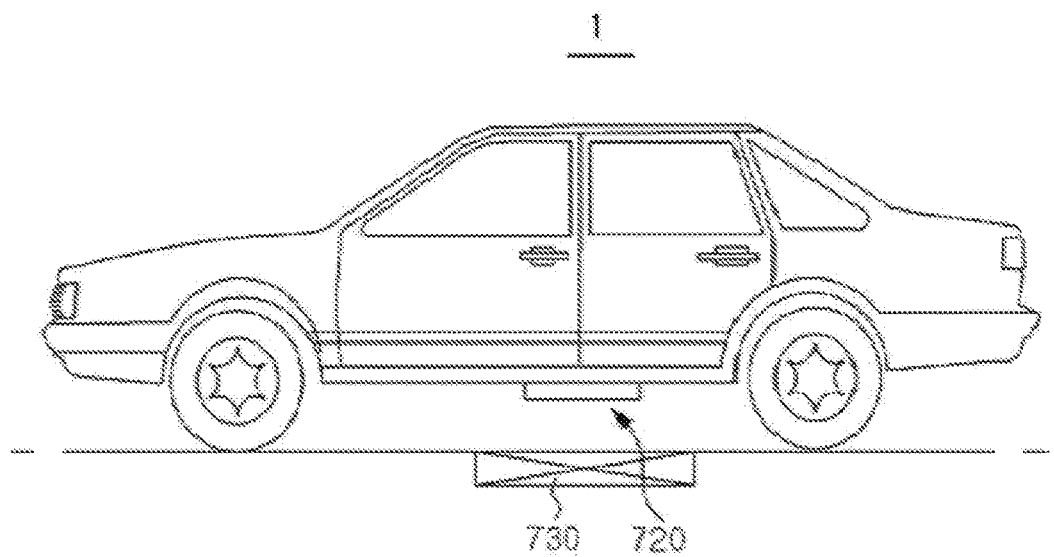

WIRELESS CHARGING DEVICE AND MOBILE MEANS INCLUDING SAME

This application is a national stage application of PCT/KR2020/013593 filed on Oct. 6, 2020, which claims priority of Korean patent application number 10-2019-0123801 filed on Oct. 7, 2019 and Korean patent application number 10-2020-0054524 filed on May 7, 2020. The disclosure of each of the foregoing applications is incorporated herein by reference in its entirety.

TECHNICAL FIELD

Embodiments relate to a wireless charging device and a transportation means comprising the same. More specifically, the embodiments relate to a wireless charging device with enhanced charging efficiency through a heat dissipation structure and a transportation means comprising the same.

BACKGROUND ART

In recent years, the information and communication field is being developed at a very fast pace, and various technologies that comprehensively combine electricity, electronics, communication, and semiconductor are continuously being developed. In addition, as electronic devices tend to be more mobile, research on wireless communication and wireless power transmission technologies is being actively conducted in the communication field. In particular, research on a method for wirelessly transmitting power to electronic devices is being actively conducted.

The wireless power transmission refers to wirelessly transmitting power through space using inductive coupling, capacitive coupling, or an electromagnetic field resonance structure such as an antenna without physical contact between a transmitter that supplies power and a receiver that receives power. The wireless power transmission is suitable for portable communication devices, electric vehicles, and the like that require a large-capacity battery. Since the contacts are not exposed, there is little risk of a short circuit, and a charging failure phenomenon in a wired method can be prevented.

Meanwhile, as interest in electric vehicles has rapidly increased in recent years, interest in building charging infrastructure is increasing. Various charging methods have already appeared, such as electric vehicle charging using home chargers, battery replacement, rapid charging devices, and wireless charging devices. A new charging business model has also begun to appear (see Korean Laid-open Patent Publication No. 2011-0042403). In addition, electric vehicles and charging stations that are being tested begin to stand out in Europe. In Japan, electric vehicles and charging stations are being piloted, led by automakers and power companies.

In a conventional wireless charging device used for electric vehicles, a magnetic unit is disposed adjacent to a coil unit to enhance the wireless charging efficiency, and a metal plate for shielding is disposed to be spaced apart from the magnetic unit by a predetermined interval.

A wireless charging device generates heat due to the resistance of a coil and the magnetic loss of a magnetic unit during the wireless charging operation. In particular, the magnetic unit in a wireless charging device generates heat in a part close to the coil with a high electromagnetic wave energy density. The generated heat may change the magnetic characteristics of the magnetic unit and cause an impedance mismatch between the transmitting and receiving devices, which deteriorates the charging efficiency. As a result, the generation of heat is, in turn, aggravated. However, since such a wireless charging device is installed in the lower part of an electric vehicle, a sealed structure is adopted for dustproofing, waterproofing, and shock absorption. Thus, it is difficult to implement a heat dissipation structure.

DETAILED DESCRIPTION OF THE INVENTION

Technical Problem

The technical problem to be solved by the present invention is to provide a wireless charging device, which comprises a heat transfer unit disposed in contact with at least a portion of the magnetic unit, whereby heat generated in the magnetic unit can be efficiently dissipated to the outside and the charging efficiency can be enhanced, and a transportation means comprising the same.

Solution to the Problem

According to an embodiment of the present invention, there is provided a wireless charging device, which comprises a coil unit; a magnetic unit disposed on the coil unit; and a heat transfer unit disposed in contact with at least a portion of the magnetic unit.

According to another embodiment, there is provided a transportation means, which comprises a wireless charging device, wherein the wireless charging device comprises a coil unit; a magnetic unit disposed on the coil unit; and a heat transfer unit disposed in contact with at least a portion of the magnetic unit.

Advantageous Effects of the Invention

According to the embodiment, the wireless charging device of the present invention comprises a heat transfer unit disposed in contact with at least a portion of the magnetic unit, whereby heat generated during wireless charging can be efficiently dissipated to the outside, so that the heat dissipation and charging efficiency can be further enhanced.

Accordingly, the wireless charging device can be advantageously used in a transportation means such as electric vehicles that require large-capacity power transmission between a transmitter and a receiver.

BRIEF DESCRIPTION OF THE DRAWING

FIG. 1A is an exploded perspective view of a wireless charging device according to an embodiment.

FIG. 1B is an exploded perspective view of a wireless charging device according to another embodiment.

FIG. 2A is a perspective view of a wireless charging device according to an embodiment.

FIG. 2B is a perspective view of a wireless charging device according to another embodiment.

FIG. 3A is a cross-sectional view taken along line D-D' in FIG. 2A and shows a cross-sectional view of a wireless charging device having a heat transfer unit and a magnetic unit in an injection-integrated structure.

FIG. 3B is a cross-sectional view of a wireless charging device according to another embodiment having a structure formed by coupling a magnetic unit with a heat transfer unit after injection thereof.

FIG. 3C is a cross-sectional view taken along line E-E' in FIG. 2B and shows a cross-sectional view of a wireless charging device having a heat transfer unit and a magnetic unit in an injection-integrated structure.

FIG. 4A is a cross-sectional view of a wireless charging device according to an embodiment having a heat transfer unit directly connected to an external cooling system.

FIG. 4B is a cross-sectional view of a wireless charging device according to an embodiment having a heat transfer unit indirectly connected to an external cooling system.

FIG. 4C is a cross-sectional view of a wireless charging device according to another embodiment having a heat transfer unit indirectly connected to an external cooling system.

FIG. 4D is a cross-sectional view of a wireless charging device according to another embodiment having a heat transfer unit directly connected to an external cooling system.

FIG. 5 is a cross-sectional view of a heat transfer unit taken along line A-A' in FIG. 1A.

FIG. 6 is a cross-sectional view of a heat transfer unit taken along line B-B' in FIG. 1A.

FIG. 7 is a cross-sectional view of a magnetic element taken along line C-C' in FIG. 1A.

FIG. 8A is a top view of a magnetic element having a heat transfer unit according to an embodiment one end of which has a straight shape.

FIG. 8B is a top view of a magnetic element having a heat transfer unit according to an embodiment one end of which has a curved shape disposed along the heat generation part of a coil.

FIG. 8C is a top view of a magnetic element having a heat transfer unit according to an embodiment one end of which has a "T" shape disposed along the heat generation part of a coil.

FIG. 8D is a top view of a magnetic element having a heat transfer unit according to an embodiment in which the ribbon sheets of the heat transfer unit are disposed along the heat generation part of a coil.

FIG. 8E is a top view of a magnetic element having a heat transfer unit according to an embodiment in which the mesh sheets of the heat transfer unit are disposed along the heat generation part of a coil.

FIG. 8F is a top view of a magnetic element having a heat transfer unit according to an embodiment in which the heat-transferable sheets of the heat transfer unit are disposed along the heat generation part of a coil.

FIG. 9 illustrates a process of forming a magnetic unit through a mold according to an embodiment.

FIG. 10 shows a transportation means (electric vehicle) provided with a wireless charging device according to an embodiment connected to a cooling system.

FIG. 11 shows a transportation means (electric vehicle) provided with a wireless charging device according to an embodiment.

BEST MODE FOR CARRYING OUT THE INVENTION

Hereinafter, specific embodiments for implementing the idea of the present invention will be described in detail with reference to the drawings.

Further, in the description of the present invention, if it is determined that a detailed description of a related known constitution or function may obscure the gist of the present invention, the detailed description thereof will be omitted.

In addition, in the accompanying drawings, some components are exaggerated, omitted, or schematically illustrated, and the size of each component does not fully reflect the actual size.

The terms in the present specification are used only to describe specific embodiments and are not intended to limit the present invention. A singular expression encompasses a plural expression unless the context clearly dictates otherwise.

The same reference numerals in the present specification refer to the same elements. In the present specification, in the case where an element is mentioned to be formed "on" or "under" another element, it means not only that one element is directly formed "on" or "under" another element, but also that one element is indirectly formed on or under another element with other element(s) interposed between them.

In addition, the term on or under with respect to each element may be referenced to the drawings. For the sake of description, the sizes of individual elements in the appended drawings may be exaggeratedly depicted, and they may differ from the actual sizes.

In addition, the term "comprising," as used herein, specifies a particular characteristic, region, integer, step, operation, element, and/or component, and it does not exclude the presence or addition of other specific characteristic, region, integer, step, operation, element, component, and/or group.

In addition, all numbers expressing the physical properties, dimensions, and the like of elements used herein are to be understood as being modified by the term "about" unless otherwise indicated.

In the present specification, a singular expression is understood to encompass a singular or plural expression, interpreted in context, unless otherwise specified.

[Wireless Charging Device]

FIGS. 1A and 1B each are an exploded perspective view of a wireless charging device according to an embodiment. FIGS. 2A and 2B each are a perspective view of a wireless charging device according to an embodiment.

The wireless charging device (10) according to an embodiment of the present invention comprises a coil unit (200); a magnetic unit (300) disposed on the coil unit (200); and a heat transfer unit (400) disposed in contact with at least a portion of the magnetic unit (300). In addition, the wireless charging device (10) may further comprise a support unit (100) for supporting the coil unit (200), a shield unit (500) disposed on the magnetic unit, and a housing (600) for protecting the components.

According to an embodiment, the wireless charging device of the present invention comprises a heat transfer unit disposed in contact with at least a portion of the magnetic unit, whereby heat generated during wireless charging can be efficiently dissipated to the outside, so that the heat dissipation and charging efficiency can be further enhanced.

Accordingly, the wireless charging device can be advantageously used in a transportation means such as electric vehicles that require large-capacity power transmission between a transmitter and a receiver.

Hereinafter, each constitutional element of the wireless charging device will be described in detail.

Coil Unit

The wireless charging device according to an embodiment of the present invention comprises a coil unit through which an alternating current flows to generate a magnetic field.

The coil unit may comprise a conductive wire.

The conductive wire comprises a conductive material. For example, the conductive wire may comprise a conductive metal. Specifically, the conductive wire may comprise at least one metal selected from the group consisting of copper, nickel, gold, silver, zinc, and tin.

In addition, the conductive wire may have an insulating sheath. For example, the insulating sheath may comprise an insulating polymer resin. Specifically, the insulating sheath may comprise a polyvinyl chloride (PVC) resin, a polyethylene (PE) resin, a Teflon resin, a silicone resin, a polyurethane resin, or the like.

The conductive wire may have a diameter of, for example, 1 mm to 10 mm, 1 mm to 5 mm, or 1 mm to 3 mm.

The conductive wire may be wound in the form of a planar coil. Specifically, the planar coil may comprise a planar spiral coil. In addition, the planar shape of the coil may be an ellipse, a polygon, or a polygonal shape with rounded corners, but it is not particularly limited thereto.

The planar coil may have an outer diameter of 5 cm to 100 cm, 10 cm to 50 cm, 10 cm to 30 cm, 20 cm to 80 cm, or 50 cm to 100 cm. As a specific example, the planar coil may have an outer diameter of 10 cm to 50 cm.

In addition, the planar coil may have an inner diameter of 0.5 cm to 30 cm, 1 cm to 20 cm, or 2 cm to 15 cm.

The number of turns of the planar coil may be 5 to 50 times, 10 to 30 times, 5 to 30 times, 15 to 50 times, or 20 to 50 times. As a specific example, the planar coil may be formed by winding the conductive wire 10 to 30 times.

In addition, the distance between the conductive wires in the planar coil shape may be 0.1 cm to 1 cm, 0.1 cm to 0.5 cm, or 0.5 cm to 1 cm.

Within the preferred dimensions and specification ranges of the plane coil as described above, it can be appropriately used in the fields such as electric vehicles that require large-capacity power transmission.

The coil unit may be disposed to be spaced apart from the magnetic unit by a predetermined interval. For example, the spaced distance between the coil unit and the magnetic unit may be 0.2 mm or more, 0.5 mm or more, 0.2 mm to 3 mm, or 0.5 mm to 1.2 mm Magnetic Unit The magnetic unit may form a magnetic path of a magnetic field formed around the coil unit and is disposed between the coil unit and the shield unit.

The magnetic unit may be disposed to be spaced apart from the shield unit by a predetermined interval. For example, the spaced distance between the magnetic unit and the shield unit may be 3 mm or more, 5 mm or more, 3 mm to 10 mm, or 4 mm to 7 mm.

In addition, the magnetic unit may be disposed to be spaced apart from the coil unit by a predetermined interval. For example, the spaced distance between the magnetic unit and the coil unit may be 0.2 mm or more, 0.5 mm or more, 0.2 mm to 3 mm, or 0.5 mm to 1.5 mm.

The magnetic unit may comprise a polymer-type magnetic unit comprising a binder resin and a magnetic powder.

Alternatively, the magnetic unit may comprise a metallic magnetic unit, for example, a nanocrystalline magnetic unit.

Alternatively, the magnetic unit may further comprise an oxide-based magnetic unit.

The magnetic unit may comprise a composite thereof.

Polymer-Type Magnetic Unit

The magnetic unit may comprise a magnetic unit comprising a binder resin and a magnetic powder dispersed in the binder resin.

As a result, since the magnetic powder is coupled with each other by the binder resin, the polymer-type magnetic unit may have fewer defects over a large area and less damage caused by an impact.

The magnetic powder may be an oxide magnetic powder such as ferrite (Ni—Zn-based, Mg—Zn-based, Mn—Zn-based ferrite, and the like); a metallic magnetic powder such as permalloy, sendust, and nanocrystalline magnetic materials; or a mixed powder thereof. More specifically, the magnetic powder may be sendust particles having a Fe—Si—Al alloy composition.

As an example, the magnetic powder may have a composition of the following Formula 1.

 [Formula 1]

In the above formula, X is Al, Cr, Ni, Cu, or a combination thereof; Y is Mn, B, Co, Mo, or a combination thereof; 0.01≤a≤0.2, 0.01≤b≤0.1, and 0≤c≤0.05.

The magnetic powder may have an average particle diameter in the range of about 3 nm to 1 mm, about 1 μm to 300 μm, about 1 μm to 50 μm, or about 1 μm to 10 μm. The polymer-type magnetic unit may comprise the magnetic powder in an amount of 50% by weight or more, 70% by weight or more, or 85% by weight or more.

For example, the polymer-type magnetic unit may comprise the magnetic powder in an amount of 50% by weight to 99% by weight, 70% by weight to 95% by weight, 70% by weight to 90% by weight, 75% by weight to 90% by weight, 75% by weight to 95% by weight, 80% by weight to 95% by weight, or 80% by weight to 90% by weight.

The binder resin may be a curable or thermoplastic resin. Specifically, the binder resin may comprise a photocurable resin, a thermosetting resin, and/or a highly heat-resistant thermoplastic resin.

The curable resin may be a resin comprising at least one functional group or moiety that can be cured by heat such as a glycidyl group, an isocyanate group, a hydroxyl group, a carboxyl group, or an amide group; or at least one functional group or moiety that can be cured by active energy such as an epoxide group, a cyclic ether group, a sulfide group, an acetal group, or a lactone group. Such a functional group or moiety may be, for example, an isocyanate group (—NCO), a hydroxyl group (—OH), or a carboxyl group (—COOH).

Specifically, examples of the curable resin include a polyurethane resin, an acrylic resin, a polyester resin, an isocyanate resin, or an epoxy resin having at least one functional group or moiety as described above, but it is not limited thereto.

As an example, the binder resin may comprise a polyurethane-based resin, an isocyanate-based curing agent, and an epoxy-based resin.

In addition, the magnetic unit may comprise, based on the weight thereof, 6% by weight to 12% by weight of a polyurethane-based resin, 0.5% by weight to 2% by weight of an isocyanate-based curing agent, and 0.3% by weight to 1.5% by weight of an epoxy-based resin, as the binder resin.

In addition, the binder resin may be a thermoplastic resin. The thermoplastic resin may be, for example, at least one selected from the group consisting of polyimide, polyamide, polycarbonate, acrylonitrile-butadiene-styrene copolymer (ABS), polypropylene, polyethylene, polystyrene, polyethylene terephthalate, polybutylene terephthalate, polyphenylsulfide, polyetheretherketone, or a combination thereof.

The magnetic unit may comprise the binder resin in an amount of 5% by weight to 40% by weight, 5% by weight to 20% by weight, 5% by weight to 15% by weight, or 7% by weight to 15% by weight.

In addition, the polymer-type magnetic unit may comprise, based on the weight thereof, 6% by weight to 12% by weight of a polyurethane-based resin, 0.5% by weight to 2% by weight of an isocyanate-based curing agent, and 0.3% by weight to 1.5% by weight of an epoxy-based resin, as the binder resin.

Nanocrystalline Magnetic Unit

The magnetic unit may comprise a nanocrystalline magnetic unit.

If the nanocrystalline magnetic unit is adopted, the higher the distance from the coil unit, the lower the resistance (Rs) even if the inductance (Ls) of the coil unit is lowered, so that the quality factor (Q factor: Ls/Rs) of the coil is increased, which may enhance the charging efficiency and reduce the generation of heat.

For example, the nanocrystalline magnetic unit may be a Fe-based nanocrystalline magnetic unit. Specifically, it may be a Fe—Si—Al-based nanocrystalline magnetic unit, a Fe—Si—Cr-based nanocrystalline magnetic unit, or a Fe—Si—B—Cu—Nb-based nanocrystalline magnetic unit.

More specifically, the nanocrystalline magnetic unit may be a Fe—Si—B—Cu—Nb-based nanocrystalline magnetic unit. In such a case, it is preferable that Fe is 70% by element to 85% by element, the sum of Si and B is 10% by element to 29% by element, and the sum of Cu and Nb is 1% by element to 5% by element (wherein % by element refers to the percentage of the number of specific elements to the total number of elements constituting the magnetic unit). Within the above composition ranges, a Fe—Si—B—Cu—Nb-based alloy can be easily formed into a nanophase crystalline form by thermal treatment.

The nanocrystalline magnetic unit is prepared by, for example, a rapid solidification process (RSP) by melt-spinning a Fe-based alloy. It may be prepared by performing a zero-field thermal treatment for 30 minutes to 2 hours in a temperature range of 300° C. to 700° C.

If the thermal treatment temperature is lower than 300° C., nanocrystals are not sufficiently formed, so that the desired magnetic permeability is not obtained, which requires a longer thermal treatment time. If it exceeds 700° C., the magnetic permeability may be significantly lowered by excessive thermal treatment. In addition, when the thermal treatment temperature is low, the treatment time is long. On the other hand, when the thermal treatment temperature is high, the treatment time is preferably shortened.

It is difficult to make the nanocrystalline magnetic unit thick due to the features of the preparation process. For example, it may be formed to a thickness of 15 μm to 35 μm.

Oxide-Based Magnetic Unit

The magnetic unit may comprise an oxide-based magnetic unit.

For example, the oxide-based magnetic unit may be a ferrite-based material. A specific chemical formula thereof may be represented by $MOFe_2O_3$ (wherein M is one or more divalent metal elements such as Mn, Zn, Cu, and Ni). The ferrite-based material is preferably a sintered body from the viewpoint of such magnetic characteristics as magnetic permeability. More specifically, it may be a ferrite sintered body. The ferrite-based material may be prepared in the form of a sheet or a block by mixing raw materials followed by calcining, pulverizing, mixing with a binder resin, molding, and sintering.

More specifically, the oxide-based magnetic unit may be a Ni—Zn-based, Mg—Zn-based, or Mn—Zn-based ferrite. In particular, Mn—Zn-based ferrite may exhibit high magnetic permeability, low magnetic permeability loss, and high saturation magnetic flux density over a temperature range of room temperature to 100° C. or higher at a frequency of 79 kHz to 90 kHz.

The Mn—Zn-based ferrite comprises 66% by mole to 70% by mole of $Fe_2O_3$, 10% by mole to 20% by mole of ZnO, 8% by mole to 24% by mole of MnO, and 0.4% by mole to 2% by mole of NiO as main components and may further comprise $SiO_2$, CaO, $Nb_2O_5$, $ZrO_2$, SnO, and the like as additional subcomponents. The Mn—Zn-based ferrite may be prepared in the form of a sheet or a block by mixing the main components at predetermined molar ratios, calcining them in the air at a temperature of 800° C. to 1,100° C. for 1 hour to 3 hours, adding the subcomponents thereto and pulverizing them, mixing them with a binder resin such as polyvinyl alcohol (PVA) in an appropriate amount, press-molding them using a press, and sintering them by raising the temperature to 1,200° C. to 1,300° C. for 2 hours or longer. Thereafter, it is processed using a wire saw or a water jet and cut to a required size, if necessary.

Process for Preparing a Magnetic Unit

The magnetic unit may comprise, for example, a polymer-type magnetic unit, and the polymer-type magnetic unit may be prepared by a sheet-forming process such as mixing a magnetic powder and a thermosetting polymer resin composition to form a slurry, then molding it into a sheet shape, and curing it.

In addition, it may be formed into a three-dimensional structure by a mold to prepare a large-area magnetic unit having a constant thickness using a thermoplastic resin. Specifically, a magnetic powder and a thermoplastic resin are kneaded using mechanical shear force and heat and then pelletized using a mechanical device and injection molded to prepare a block.

A conventional sheet-forming or block-forming method may be applied to the preparation process.

The magnetic unit may be elongated at a certain ratio. For example, the elongation of the magnetic unit may be 0.5% or more. The elongation characteristic is difficult to obtain in a ceramic-based magnetic unit to which a polymer is not applied. It may reduce damage even if a large-area magnetic unit is distorted by an impact. Specifically, the elongation of the magnetic unit may be 0.5% or more, 1% or more, or 2.5% or more. There is no particular limitation to the upper limit of the elongation. However, if the content of the polymer resin is increased to enhance the elongation, such physical properties of the magnetic unit as inductance may be deteriorated. Thus, the elongation is preferably 10% or less.

The molding may be carried out by injecting the raw materials for the magnetic unit into a mold by injection molding. More specifically, the magnetic unit may be prepared by mixing a magnetic powder and a polymer resin composition to obtain a raw material composition, and then injecting the raw material composition (801) into a mold (803) by an injection molding machine (802) as shown in FIG. 9. In such an event, the internal shape of the mold (803) may be designed as a three-dimensional structure, so that the three-dimensional structure of the magnetic unit may be easily achieved. Such a process may be advantageous in terms of the degree of freedom of the structure as compared with the case where a conventional sintered ferrite sheet is used as a magnetic unit.

Area and Thickness of a Magnetic Unit

The magnetic unit may be a magnetic sheet, a magnetic sheet laminate, or a magnetic block.

The magnetic unit may have a large area. Specifically, it may have an area of 200 $cm^2$ or more, 400 $cm^2$ or more, or 600 $cm^2$ or more. In addition, the magnetic unit may have an area of 10,000 $cm^2$ or less.

The large-area magnetic unit may be configured by combining a plurality of magnetic units. In such an event, the area of the individual magnetic units may be 60 cm² or more, 90 cm², or 95 cm² to 900 cm².

The magnetic sheet may have a thickness of 15 μm or more, 50 μm or more, 80 μm or more, 15 μm to 150 μm, 15 μm to 35 μm, or 85 μm to 150 μm. Such a magnetic sheet may be prepared by a method of preparing a conventional film or sheet.

The magnetic sheet laminate may be one in which 20 or more or 50 or more magnetic sheets are laminated. In addition, the magnetic sheet laminate may be one in which 150 or fewer or 100 or fewer magnetic sheets are laminated.

The magnetic block may have a thickness of 1 mm or more, 2 mm or more, 3 mm or more, or 4 mm or more. In addition, the magnetic block may have a thickness of 6 mm or less.

Magnetic Characteristics of the Magnetic Unit

The magnetic unit may have magnetic characteristics of a certain level in the vicinity of a standard frequency for wireless charging of an electric vehicle.

The standard frequency for wireless charging of an electric vehicle may be less than 100 kHz, specifically, 79 kHz to 90 kHz, specifically, 81 kHz to 90 kHz, more specifically, about 85 kHz. It is a band distinct from the frequency applied to mobile electronic devices such as cell phones.

For example, the magnetic unit may have a magnetic permeability of 5 to 150,000, 10 to 150,000, 20 to 150,000, 5 to 300, 30 to 300, 600 to 3,500, or 10,000 to 150,000 in a frequency band of 79 kHz to 90 kHz. Specifically, the magnetic permeability of the magnetic unit may be 30 to 300, 600 to 3,500, or 10,000 to 150,000 in a frequency band of 79 kHz to 90 kHz. More specifically, the magnetic permeability of the magnetic unit may be 30 to 250 or 30 to 200 in a frequency band of 79 kHz to 90 kHz.

In addition, the magnetic unit may have a magnetic permeability loss of 1 to 150,000, 1 to 50,000, 5 to 30,000, 10 to 3,000, 10 to 1,000, 100 to 1,000, or 5,000 to 50,000 in a frequency band of 79 kHz to 90 kHz.

Specifically, the magnetic unit may have a magnetic permeability of 30 to 200 and a magnetic permeability loss of 10 to 3,000 in a frequency band of 79 kHz to 90 kHz.

Physical Properties of the Magnetic Unit

The polymer-type magnetic unit may be elongated at a certain ratio. For example, the elongation of the polymer-type magnetic unit may be 0.5% or more. The elongation characteristic is difficult to obtain in a ceramic-based magnetic unit to which a polymer is not applied. It may reduce damage even if a large-area magnetic unit is distorted by an impact. Specifically, the elongation of the polymer-type magnetic unit may be 0.5% or more, 1% or more, or 2.5% or more. There is no particular limitation to the upper limit of the elongation. However, if the content of the polymer resin is increased to enhance the elongation, such physical properties of the magnetic unit as inductance may be deteriorated. Thus, the elongation is preferably 10% or less.

The magnetic unit has a small rate of change in physical properties before and after an impact and is significantly superior to those of conventional ferrite magnetic sheets.

In the present specification, the rate of change (%) in physical properties before and after an impact may be calculated by the following equation.

$$\text{Rate of change (\%) in characteristic} = |\text{characteristic value before impact} - \text{characteristic value after impact}| / \text{property value before impact} \times 100$$

For example, when the magnetic unit is subjected to free-falling from a height of 1 m, it may have a rate of change in inductance of less than 5% or 3% or less before and after the impact. More specifically, the rate of change in inductance may be 0% to 3%, 0.001% to 2%, or 0.01% to 1.5%. Within the above range, since the rate of change in inductance before and after an impact is relatively small, the stability of the magnetic unit may be further enhanced.

In addition, when the magnetic unit is subjected to free-falling from a height of 1 m, it may have a rate of change in Q factor of 0% to 5%, 0.001% to 4%, or 0.01% to 2.5%, before and after the impact. Within the above range, since the change in physical properties before and after an impact is small, the stability and impact resistance of the magnetic unit may be further enhanced.

In addition, when the magnetic unit is subjected to free-falling from a height of 1 m, it may have a rate of change in resistance of 0% to 2.8%, 0.001% to 1.8%, or 0.1% to 1.0%, before and after the impact. Within the above range, even if it is repeatedly applied in an environment where actual impact and vibration are applied, the resistance value can be well maintained below a certain level.

In addition, when the magnetic unit is subjected to free-falling from a height of 1 m, it may have a rate of change in charging efficiency of 0% to 6.8%, 0.001% to 5.8%, or 0.01% to 3.4%, before and after the impact. Within the above range, even if a large-area magnetic unit is repeatedly subjected to impact or distortion, its physical properties can be more stably maintained.

Heat Transfer Unit

The heat transfer unit may serve to efficiently dissipate heat generated during wireless charging to the outside.

Referring to FIGS. 1A and 2A, the heat transfer unit (400) may be thermally connected to the magnetic unit (300) and extend to the outside of the housing (600). For example, at least a part of one end of the heat transfer unit (400) may be inserted into the magnetic unit (300), and another end different from the one end may be exposed to the outside of the housing (600).

The heat transfer unit according to an embodiment of the present invention may comprise a heat medium and a container unit.

Specifically, referring to FIGS. 5 and 6, the heat transfer unit (400) may comprise a heat medium (430) capable of evaporation and condensation; and a container unit (410) for accommodating the heat medium.

The container unit (410) may have a tube shape comprising a sealed inner space. Specifically, in the heat transfer unit, a volatile heat medium is injected into a closed container in the form of a tube, and the container is then sealed in a vacuum state. In the course of repeated evaporation and condensation of the heat medium filled inside the tube, it can cool around the magnetic unit.

That is, it is possible to effectively transfer heat without power even with a small temperature difference by using the latent heat of evaporation of the heat medium (fluid) inside the heat transfer unit. It can serve to efficiently dissipate heat generated during wireless charging to the outside.

The heat medium (430) may comprise nanoparticles in water, oil, or the like. Alternatively, the heat medium (430) may comprise a liquid for a high temperature or a low temperature depending on the temperature. More specifically, the heat medium (430) may comprise, for example, one or more selected from the group consisting of water, methanol, acetone, ethylene glycol, propylene glycol, and mercury. Since the heat medium (430) dissipates heat generated from the magnetic unit to the outside in the course of repeated evaporation and condensation thereof inside the heat transfer unit, its performance may be superior to the conventional cooling methods by more than 6 times or more. The container unit (410) may be a container having a high thermal conductivity and a thin thickness in most parts. For example, it may comprise metal or ceramic.

The inner space of the container unit (410) may have a length (d) of 10 cm to 50 cm. It may be, for example, 20 cm to 45 cm, for example, 30 cm to 40 cm.

The inner space of the container unit may have an internal diameter (ID) of 0.1 mm to 5 mm. It may be, for example, 0.5 mm to 3 mm, for example, 0.5 mm to 2 mm, for example, 2 mm to 5 mm. If a container unit having an inner diameter within the above range is adopted, the charging efficiency and heat dissipation characteristics desired in the present invention may be further enhanced.

In addition, the heat transfer unit may further comprise a migration unit (420).

The migration unit (420) is disposed in the container unit (410), has a porous structure, and absorbs and migrates the heat medium in a liquid state when the heat medium is in a liquid state.

For example, the migration unit (420) has a mesh shape made of a very thin metal and is attached to the inner wall of the heat transfer unit, and the heat medium (430) is filled in the container unit (410).

The heat transfer unit comprises an evaporator section (440) and a condenser section (450). In the evaporator section (440), the heat medium (430) absorbs heat from a heat source evaporated as heat is generated in the magnetic unit, and the heat medium (430) is evaporated to a gas state, so that heat may be transferred from the evaporator section (440) to the condenser section (450). To the contrary, in the condenser section (450), heat is dissipated to the outside at a lower temperature, and the heat medium (430) in a gas state is condensed. That is, the heat medium evaporated in the evaporator section may be condensed in the condenser section. As this is repeated, heat is transferred from the evaporator section (440) to the condenser section (450), and heat can be effectively dissipated to the outside.

When heat is transferred to the evaporator section (440), the heat medium (430) in the equilibrium state is evaporated. For example, the vaporized heat medium (430) may move in the heat transfer unit due to a difference in pressure between the evaporator section (440) and the condenser section (450). When heat is transferred to the condenser section (450), the gas moved to the condenser section due to the pressure gradient may change its phase and condense into a saturated liquid.

In addition, the condenser section (450) may be disposed at a higher position than the evaporator section (440). It is configured such that the high-temperature heat medium (430) in a vapor phase evaporated in the evaporator section (440) naturally moves to the upper condenser section (450), and the low-temperature heat medium (430) in a liquid phase condensed in the condenser section (450) naturally returns to the lower evaporator section (440) by gravity.

In addition, the heat transfer unit may further comprise an adiabatic section (460) between the evaporator section (440) and the condenser section (450). The adiabatic section (460) may prevent the heat leakage from the inside when the heat medium (430) vaporized in the evaporator section (440) moves to the condenser section (450).

The heat transfer unit may comprise various structures. For example, the heat transfer unit may have a cylindrical shape, a flat plate shape, or a separate type.

FIGS. 8A to 8C each show a top view of a magnetic element (800) having a heat transfer unit (400) in various shapes according to an embodiment and a magnetic unit (300).

Specifically, the heat transfer unit (400) may have at least one end in a straight shape (see FIG. 8A).

In addition, the heat transfer unit (400) may have at least one end in a curved shape disposed along the heat generation part of a coil (see FIG. 8B).

In addition, the heat transfer unit (400) may have at least one end in a "T" shape disposed along the heat generation part of a coil (see FIG. 8C).

The description of the structures of the heat transfer unit (400) is for illustrative purposes only. Their numbers, thicknesses, shapes, sizes, positions, and structures may be designed in various ways to meet the purpose of heat dissipation within a range that does not impair the effects of the present invention.

According to an embodiment, the heat transfer unit may comprise, for example, a heat pipe. The heat transfer unit has a thermal conductivity of 500 times more than that of copper having the same cross-sectional area by virtue of the operation of the heat medium encapsulated therein, so that it is widely used as a high-efficiency heat transfer device in satellite heat control systems. In an embodiment of the present invention, as the heat transfer unit having excellent thermal conductivity is used, the heat dissipation effect can be enhanced by effectively dissipating heat generated inside the magnetic unit to the outside.

The heat transfer unit may have a thermal conductivity of 5 to 10,000 W/m·K, for example, 50 to 8,000 W/m·K, for example, 1,000 to 7,000 W/m·K, or, for example, 1,000 to 6,000 W/m·K.

In addition, the heat transfer unit may have a specific resistance of $1 \times 10^2$ to $1 \times 10^{20}$ Ω·cm, for example, $1 \times 10^3$ to $1 \times 10^{18}$ Ω·cm, for example, $1 \times 10^3$ to $1 \times 10^{16}$ Ω·cm, or, for example, $1 \times 10^3$ to $1 \times 10^{15}$ Ω·cm.

According to an embodiment of the present invention, the heat transfer unit may have a structure in contact with, or coupled to, the magnetic unit in various ways.

FIGS. 3A to 3C each show a cross-sectional view of a magnetic element in which a heat transfer unit (400) and a magnetic unit (300) are in an injection-integrated structure. Specifically, the heat transfer unit (400) may have a structure formed integrally with the magnetic unit (300) as it is inserted into the magnetic unit (300) by injection without an adhesive or a fixing member.

In such a case, there is an advantage in that heat generated inside the magnetic unit can be effectively dealt with. The structure in which the heat transfer unit is disposed inside the magnetic unit may be designed in various ways.

Referring back to FIG. 1A, a groove (401) is provided in or on the surface of the magnetic unit (300), and a part of the heat transfer unit (400) is inserted into the groove (401) to provide a structure coupled with the magnetic unit (300).

As another example, a polymer-type magnetic unit may be molded through a mold to accommodate the heat transfer unit inside the magnetic unit.

As another example, once a magnetic unit, for example, a polymer-type magnetic unit has been molded through a mold to have an inner space to which a heat transfer unit is inserted, the heat transfer unit may be inserted thereto.

In addition, the heat transfer unit may have a structure coupled to the magnetic unit by an adhesive or a fixing member.

As another example, a heat transfer unit may be interposed and stacked between a plurality of magnetic sheets to prepare a magnetic sheet laminate in which the heat transfer unit is inserted.

In addition, the heat transfer unit may be disposed adjacent to the magnetic unit. As an example, the heat transfer unit may be disposed between the magnetic unit and the shield unit. As another example, the heat transfer unit may be disposed between the magnetic unit and the coil unit. In such a case, there is an advantage in that heat generated in the magnetic unit and the coil unit can be simultaneously dealt with.

In addition, the heat transfer unit may be coupled to, or in contact with, the magnetic unit to achieve a heat dissipation effect in various ways.

The heat transfer unit according to another embodiment of the present invention may comprise a mesh sheet having a network structure, a ribbon sheet, or a thermally conductive sheet comprising a plurality of holes.

Referring to FIGS. 1B and 2B, the wireless charging device (10) comprises a heat transfer unit (400) disposed inside the magnetic unit (300), wherein the heat transfer unit (400) comprises a mesh sheet having a network structure, a ribbon sheet, or a thermally conductive sheet comprising a plurality of holes.

According to an embodiment of the present invention, as a heat transfer unit comprising a mesh sheet having a network structure, a ribbon sheet, or a thermally conductive sheet comprising a plurality of holes is adopted, which is an open structure so that a magnetic field can travel inside the magnetic unit used in the wireless charging device, heat generated in the magnetic unit can be readily dissipated, and the charging efficiency can be further enhanced.

In particular, if the heat transfer unit having a high thermal conductivity is directly connected to the shield unit or directly or indirectly connected to an external cooler, it is possible to effectively reduce the temperature inside the magnetic unit. Further, as the heat transfer unit comprises a sheet of an open structure having a mesh structure or holes, it is possible to maximize the heat reduction effect of the wireless charging device.

FIGS. 8D to 8F each show a top view of a magnetic element (800) having a heat transfer unit (400) in various shapes according to an embodiment and a magnetic unit (300). The heat transfer unit (400) may comprise a ribbon sheet (see FIG. 8D).

In addition, the heat transfer unit (400) may comprise a mesh sheet having a network structure (see FIG. 8E).

In addition, the heat transfer unit (400) may comprise a thermally conductive sheet comprising a plurality of holes (601) (see FIG. 8F).

Referring to FIGS. 1B, 3C, and 8D, the heat transfer unit (400) having a ribbon sheet may comprise at least two or more thereof spaced apart at regular intervals. Although FIGS. 1B, 3C, and 8D illustrate a case in which a ribbon sheet is adopted in the magnetic unit (300), the heat transfer unit may be modified to comprise a mesh sheet having a network structure or a thermally conductive sheet comprising a plurality of holes instead of the ribbon sheet as described above.

According to an embodiment of the present invention, as the two or more ribbon sheets spaced apart are adopted, the magnetic field can smoothly travel inside the magnetic unit, and as the ribbon of a material having a high thermal conductivity is adopted, heat inside the magnetic unit can be effectively dissipated.

The width of the ribbon sheet is not particularly limited as long as the effect of the present invention is not impaired. For example, it may have a width of 5 mm to 10 mm, 5 mm to 9 mm, 5 mm to 8 mm, 5 mm to 7.5 mm, or 8 mm to 10 mm. If the width of the ribbon sheet exceeds 10 mm, it may interfere with the circulation of a magnetic field, thereby reducing the charging efficiency. If the width of the ribbon sheet is less than 5 mm, the heat dissipation effect inside the magnetic unit may be deteriorated.

Meanwhile, referring to FIGS. 8E and 8F, the mesh sheet or the thermally conductive sheet may comprise openings (holes) that are an open structure through which a magnetic field can smoothly travel inside the magnetic unit.

According to an embodiment of the present invention, the mesh sheet or the thermally conductive sheet may have an opening (hole) area of 15% to 30% of the total area of the magnetic unit. Specifically, the mesh sheet or the thermally conductive sheet may have an opening (hole) area of 18% to 25% of the total area of the magnetic unit. Within the above range, the flow of a magnetic field within the magnetic unit may be more favorable.

The mesh sheet or the thermally conductive sheet may comprise holes having an inner diameter of 500 μm to 1,500 μm, specifically, 700 μm to 1,200 μm, more specifically, 800 μm to 1,000 μm. If the mesh sheet or the thermally conductive sheet comprises holes having an inner diameter within the above range, the charging efficiency and heat dissipation characteristics desired in the present invention may be further enhanced.

The type of ribbon sheet, mesh sheet, or thermally conductive sheet adopted in the heat transfer unit may be without limitation as long as the desired effect of the present invention is achieved. Specifically, it may comprise a metallic material comprising at least one selected from the group consisting of aluminum, copper, silver, and gold as a thermally conductive material.

The heat transfer unit may have sufficient thermal conductivity to transfer heat inside the magnetic unit. Specifically, the heat transfer unit may have a thermal conductivity of 230 W/m·K to 430 W/m·K, 237 W/m·K to 429 W/m·K, 237 W/m·K to 401 W/m·K, 230 W/m·K to 300 W/m·K, or 301 W/m·K to 430 W/m·K.

The heat transfer unit may have a heat capacity of 24 J/mole·K to 25.5 J/mole·K, 24.2 J/mole·K to 25.3 J/mole·K, 24.5 J/mole·K to 25.5 J/mole·K, or 24 J/mole·K to 24.5 J/mole·K.

The thickness ratio of the heat transfer unit to the magnetic unit may be 1:10 to 250, 1:20 to 200, 1:25 to 100, 1:50 to 150, or 1:10 to 80.

In addition, the area ratio of the heat transfer unit to the magnetic unit may be 1:2.3 to 5.5, 1:3 to 4.5, 1:2.3 to 3.5, or 1:3.5 to 5.5.

Meanwhile, referring to FIG. 4C, the heat transfer unit (400) may further comprise an extension (490) extending further in the longitudinal direction from at least one end of the magnetic unit (300).

In addition, referring to FIGS. 4A and 4D, the heat transfer unit (400) may comprise one or more protrusions (480) protruding from at least one end of the magnetic unit (300). That is, the protrusion (480) of the heat transfer unit (400) may refer to a part extending further to protrude in the longitudinal direction from at least one end of the magnetic unit (300).

Meanwhile, since the region in which heat is primarily generated in the magnetic unit is a region corresponding to the coil, the heat transfer unit may be disposed to correspond to the region in which the coil is present. In other words, the heat transfer unit may hardly be disposed in a central region where the density of the conductive wire is low in the coil.

In addition, the heat transfer unit may be disposed in a region in which the coil is present and in other regions, for example, a central region in which the density of the conductive wire is low.

Meanwhile, the structure in which the heat transfer unit is disposed inside the magnetic unit may be designed in various ways.

As an example, a polymer-type magnetic unit may be molded through a mold to accommodate a heat transfer unit comprising a mesh sheet, a ribbon sheet, or a thermally conductive sheet comprising a plurality of holes therein.

As another example, once a polymer-type magnetic unit has been molded through a mold to have an inner space to which the heat transfer unit is to be inserted, the heat transfer unit may be inserted thereto. In such a case, once the heat transfer unit comprising a mesh sheet, a ribbon sheet, or a thermally conductive sheet comprising a plurality of holes as a thermally conductive material has been prepared, it may be inserted to the inside of the polymer-type magnetic unit.

As another example, a heat transfer unit may be interposed and stacked between a plurality of magnetic sheets to prepare a magnetic sheet laminate in which the heat transfer unit is inserted.

The heat transfer unit may have a total internal volume of 0.5% to 1% based on the total volume of the magnetic unit. Within the above range, the flow of a magnetic field may be more favorable.

Shield Unit

The wireless charging device (10) according to an embodiment may further comprise a shield unit (500) that serves to increase the wireless charging efficiency through the shielding of electromagnetic waves.

The shield unit is disposed on one side of the coil.

The shield unit comprises a metal plate. The material thereof may be aluminum, and other metal or alloy materials having a shielding capability of electromagnetic waves may be used.

The shield unit may have a thickness of 0.2 mm to 10 mm, 0.5 mm to 5 mm, or 1 mm to 3 mm.

In addition, the shield unit may have an area of 200 cm$^2$ or more, 400 cm$^2$ or more, or 600 cm$^2$ or more.

Housing

The wireless charging device (10) according to an embodiment may further comprise a housing (600) for accommodating the coil unit (200) and the magnetic unit (300).

In addition, the housing (600) allows such components as the coil unit (200), the shield unit (500), and the magnetic unit (300) to be properly disposed and assembled. The shape (structure) of the housing may be arbitrarily determined according to the components accommodated therein or according to the environment. The material and structure of the housing may be a material and structure of a conventional housing used in a wireless charging device.

Referring back to FIG. 1, the heat transfer unit (400) may extend to the outside of the housing (600) from the magnetic unit (300). In addition, the housing (600) may comprise a hole (601) such that the heat transfer unit (400) coupled to the magnetic unit (300) may extend to the outside of the housing (600). Specifically, at least a part of one end of the heat transfer unit (400) may be inserted into the magnetic unit (300), and another end different from the one end may be exposed to the outside of the housing (600).

Support Unit

The wireless charging device (10) according to an embodiment may further comprise a support unit (100) for supporting the coil unit (200). The material and structure of the support unit may be a material and structure of a conventional support unit used in a wireless charging device. The support unit may have a flat plate structure or a structure in which a groove is formed in compliance with a coil shape to fix the coil unit.

[Various Examples of a Wireless Charging Device]

FIGS. 3A to 3C each show a cross-sectional view of the wireless charging device having various structures according to embodiments of the present invention.

The wireless charging device according to an embodiment may comprise a structure in which the heat transfer unit (400) is formed integrally with the magnetic unit (300) as it is inserted into the magnetic unit (300) by injection without an adhesive or a fixing member. In such a case, there is an advantage in that heat generated inside the magnetic unit can be effectively dealt with. The structure in which the heat transfer unit (400) is disposed inside the magnetic unit (300) may be designed in various ways.

Referring to FIGS. 3A and 3C, a magnetic unit (300) (e.g., a polymer-type magnetic unit) may be molded through a mold to accommodate the heat transfer unit (400) inside the magnetic unit (300).

In addition, referring to FIG. 3B, a groove is provided in or on the surface of the magnetic unit (300), and a part of the heat transfer unit (400) is inserted into the groove to provide a structure coupled to the magnetic unit (300).

As another example, once a magnetic unit (300), for example, a polymer-type magnetic unit has been molded through a mold to have an inner space to which a heat transfer unit (400) is inserted, the heat transfer unit (400) may be inserted thereto. In addition, the heat transfer unit (400) may have a structure coupled to the magnetic unit by an adhesive or a fixing member.

As another example, a heat transfer unit (400) may be interposed and stacked between a plurality of magnetic sheets to prepare a magnetic sheet laminate in which the heat transfer unit is inserted.

In addition, the heat transfer unit may be disposed adjacent to the magnetic unit. As an example, the heat transfer unit may be disposed between the magnetic unit and the shield unit. As another example, the heat transfer unit may be disposed between the magnetic unit and the coil unit. In such a case, there is an advantage in that heat generated in the magnetic unit and the coil unit can be simultaneously dealt with.

In addition, the heat transfer unit may be coupled to or in contact with the magnetic unit to achieve a heat dissipation effect in various ways.

In addition, referring to FIGS. 4A and 4D, the wireless charging device (10) may further comprise a cooling system (680) disposed outside the housing (600) and directly or indirectly connected to the heat transfer unit (400).

The heat transfer unit (400) may comprise one or more protrusions (480) protruding from at least one end of the magnetic unit (300). That is, the protrusion (480) of the heat transfer unit (400) may refer to a part extending further to protrude in the longitudinal direction from at least one end of the magnetic unit (300).

If the heat transfer unit comprises the protrusion, it may have a total volume of 5% to 70% based on the total volume of the magnetic unit. Within the above range, it may be more advantageous for simultaneously enhancing the electromagnetic wave shielding performance and heat dissipation characteristics of the magnetic unit. More specifically, the heat transfer unit may have a total volume of 5% to 40%, 10% to 35%, or 15% to 30%, based on the total volume of the magnetic unit.

In addition, the protrusion (480) may be directly or indirectly connected to the external cooling system (680) of the wireless charging device. In such an event, the cooling system (680) may cool the protrusion (480) by air cooling or water cooling.

The cooling system (680) may be connected to the protrusion (480) while it has a sealed structure for waterproofing and dustproofing. The cooling system (680) may be connected to the protrusion (480) through a connection passage (695). If the protrusion is connected to the cooling system (680) as described above, heat generated inside the magnetic unit can be efficiently dissipated to the outside.

In addition, the cooling system may be connected to the shield unit, and the protrusion may be connected to the shield unit connected to the cooling system.

Specifically, referring to FIG. 4C, the heat transfer unit (400) may further comprise an extension (490) extending further in the longitudinal direction from each end of the magnetic unit (300), and the extension (490) may be directly connected to the shield unit (500). Further, as the external cooling system (680) is connected to the shield unit (500), the temperature of the extension (490) of the heat transfer unit (400) can be effectively lowered. If the ribbon sheet, mesh sheet, or thermally conductive sheet adopted in the heat transfer unit is connected to the shield unit or an external cooler, the temperature of the ribbon sheet, mesh sheet, or thermally conductive sheet can be lowered by the shield unit or an external cooler. As a result, it is possible to lower the temperature of the wireless charging device as well as lower the temperature inside the magnetic part, thereby further enhancing the heat dissipation effect.

In addition, referring to FIG. 4D, the heat transfer unit (400) may comprise one or more protrusions (480) protruding from at least one end of the magnetic unit (300). The cooling system (680) may be connected to the shield unit (500) and/or the protrusion (480).

That is, referring to FIGS. 4A to 4D, the cooling system (680) may be connected to a part of at least one selected from the group consisting of the shield unit (500), the extension (490), and the protrusion (480) through a connection passage (695).

Meanwhile, the structure in which the heat transfer unit is thermally connected to the magnetic unit may be designed in various ways.

The length, structure, position, type, and physical properties of the heat transfer unit are as described above.

Meanwhile, referring to FIGS. 4A to 4C, since the region in which heat is primarily generated in the magnetic unit (300) is a region corresponding to the coil unit (200), the heat transfer unit (400) may be disposed to correspond to the region in which the coil unit (200) is present in the wireless charging device. In other words, the heat transfer unit (400) may hardly be disposed in a central region where the density of the conductive wire is low in the coil unit (200).

In addition, referring to FIG. 4D, the heat transfer unit (400) may be disposed in a region in which the coil unit (200) is present and in other regions, for example, a central region in which the density of the conductive wire is low.

Meanwhile, the housing allows such components as the coil unit, the shield unit, and the magnetic unit to be properly disposed and assembled.

The wireless charging device according to an embodiment may further comprise a support unit (100) for supporting the coil unit (200). The configuration and characteristics of the support unit, the coil unit, the shield unit, the magnetic unit, and the heat transfer unit of the wireless charging device are as described above.

In addition, the wireless charging device according to an embodiment may further comprise a spacer unit for securing a space between the shield unit and the magnetic unit. The spacer unit may comprise an empty space, and the material and structure of a conventional spacer unit adopted in a wireless charging device may be used to secure an empty space.

[Magnetic Element]

Referring to FIGS. 8A to 8F, according to an embodiment of the present invention, there is provided a magnetic element (800), which comprises a magnetic unit (300); and a heat transfer unit (400) disposed in contact with at least a portion of the magnetic unit (300).

According to an embodiment of the present invention, the magnetic element (800) comprises a magnetic unit (300); and a heat transfer unit (400) a part of which is inserted into the magnetic unit (300), wherein the heat transfer unit (400) may comprise a heat medium capable of evaporation and condensation; and a container for accommodating the heat medium.

According to another embodiment of the present invention, the magnetic element (800) comprises a magnetic unit (300); and a heat transfer unit (400) a part of which is inserted into the magnetic unit (300), wherein the heat transfer unit (400) may comprise a mesh sheet having a network structure, a ribbon sheet, or a thermally conductive sheet comprising a plurality of holes.

FIGS. 7 and 8A to 8F each show a cross-sectional view and a top view of the magnetic element having various structures according to embodiments of the present invention.

The magnetic unit (300) and the heat transfer unit (400) adopted in the magnetic element (800) and having various structures and their various structures, shapes, and positions are as described above.

Specifically, as the magnetic element (800) comprises the heat transfer part (400) a part of which is inserted into the magnetic unit (300), heat generated in the magnetic element or the magnetic unit can be readily dissipated to the outside, and charging efficiency can be further enhanced.

The top views of the magnetic elements shown in 8A to 8F are for illustrative purposes only. Their numbers, thicknesses, shapes, sizes, positions, and structures may be designed in various ways to meet the purpose of heat dissipation within a range that does not impair the effects of the present invention.

[Transportation Means]

The wireless charging device according to an embodiment can be advantageously used in a transportation means such as electric vehicles that require large-capacity power transmission between a transmitter and a receiver.

FIGS. 10 and 11 each show an electric vehicle applied as an example of the moving means (1). Referring to FIGS. 10 and 11, the wireless charging device (10) may be provided under the electric vehicle (1).

According to an embodiment, the electric vehicle comprises a wireless charging device, wherein the wireless charging device comprises a coil unit; a magnetic unit disposed on the coil unit; and a heat transfer unit thermally connected to the magnetic unit and extending to the outside.

The electric vehicle may further comprise a cooling system (680) disposed outside the housing and directly or indirectly connected to the heat transfer unit.

The configuration and characteristics of each component of the wireless charging device adopted in the electric vehicle are as described above.

A cooling device commonly provided in the electric vehicle may be used as a cooling system of the wireless charging device.

For example, the cooling system may comprise an automobile air conditioner. Specifically, referring to FIG. 10, the air conditioner provided inside the electric vehicle (1) may be used as the cooling system (680), and the air conditioner may be connected to the connection passage (695) connected to the protrusion of the heat transfer unit of the wireless charging device (10). As a result, effective heat dissipation may be possible even if a separate cooling system is not provided.

The transportation means may further comprise a battery for receiving power from the wireless charging device. The wireless charging device may receive power wirelessly and transmit it to the battery, and the battery may supply power to a driving system of the electric vehicle. The battery may be charged by power transmitted from the wireless charging device or other additional wired charging devices.

In addition, the transportation means may further comprise a signal transmitter for transmitting information about the charging to the transmitter of the wireless charging system for an electric vehicle. The information about such charging may be charging efficiency such as charging speed, charging state, and the like.

The wireless charging device may be provided under the vehicle.

The electric vehicle may be charged wirelessly in a parking area equipped with a wireless charging system for an electric vehicle.

Referring to FIG. 11, the electric vehicle (1) according to an embodiment comprises the wireless charging device according to an embodiment as a receiver (720).

The wireless charging device may serve as a receiver for wireless charging of the electric vehicle (1) and may receive power from a transmitter (730) for wireless charging system.

EXPLANATION OF REFERENCE NUMERALS

| | |
|---|---|
| 1: transportation means (electric vehicle) | 10: wireless charging device |
| 100: support unit | 200: coil unit |
| 300: magnetic unit | 400: heat transfer unit |
| 401: groove | 410: container unit |
| 420: migration unit | 430: migration of a heat medium |
| 440: evaporator section | 450: condenser section |
| 460: adiabatic section | 480: protrusion |
| 490: extension | |
| 500: shield unit | 600: housing |
| 601: hole | |
| 680: cooling system | 695: connection passage |
| 720: receiver | 730: transmitter |
| 800: magnetic element | |
| 801: raw material composition | 802: injection molding machine |
| 803: mold | |
| A-A': cutting line | B-B': cutting line |
| C-C': cutting line | D-D': cutting line |
| E-E': cutting line | |
| d: length | ID: internal diameter |

The invention claimed is:

1. A wireless charging device, which comprises:
a coil unit;
a magnetic unit disposed on the coil unit; and
a heat transfer unit disposed in contact with at least a portion of the magnetic unit,
wherein at least a part of the heat transfer unit is inserted into the magnetic unit, and
wherein the heat transfer unit is not disposed in a central region of the magnetic unit, and the coil unit is not disposed under the central region of the magnetic unit.

2. The wireless charging device of claim 1, wherein the heat transfer unit comprises a heat medium capable of evaporation and condensation; and a container unit for accommodating the heat medium, the container unit has a tube shape comprising a sealed inner space, and the inner space of the container unit has a length of 10 cm to 50 cm and an internal diameter of 0.1 mm to 5 mm.

3. The wireless charging device of claim 2, wherein the heat transfer unit comprises an evaporator section in which the heat medium is evaporated by heat generated in the magnetic unit, and a condenser section in which the heat medium evaporated in the evaporator section is condensed.

4. The wireless charging device of claim 2, wherein the heat transfer unit further comprises a migration unit disposed in the container unit, the migration unit has a porous structure and absorbs and migrates the heat medium in a liquid state when the heat medium is in a liquid state, and the container unit comprises metal or ceramic.

5. The wireless charging device of claim 2, wherein the heat transfer unit has a thermal conductivity of 5 to 10,000 W/m·K and a specific resistance of $1\times10^2$ to $1\times10^{20}$ Ω·cm.

6. The wireless charging device of claim 1, wherein the heat transfer unit comprises a mesh sheet having a network structure, a ribbon sheet, or a thermally conductive sheet comprising a plurality of holes.

7. The wireless charging device of claim 6, wherein the mesh sheet or the thermally conductive sheet has an opening (hole) area of 15% to 30% of the total area of the magnetic unit, and the ribbon sheet comprises two or more thereof spaced apart by a predetermined interval and has a width of 5 mm to 10 mm.

8. The wireless charging device of claim 6, wherein the heat transfer unit comprises a metallic material comprising at least one selected from the group consisting of aluminum, copper, silver, and gold.

9. The wireless charging device of claim 6, wherein the heat transfer unit has a thermal conductivity of 230 W/m·K to 430 W/m·K and a heat capacity of 24 J/mole·K to 25.5 J/mole·K.

10. The wireless charging device of claim 1, which further comprises a housing for accommodating the coil unit and the magnetic unit, wherein the heat transfer unit is thermally connected to the magnetic unit and extends from the magnetic unit to the outside of the housing.

11. The wireless charging device of claim 10, wherein one end of the heat transfer unit is inserted into the magnetic unit, and another end of the heat transfer unit is exposed to the outside of the housing.

12. The wireless charging device of claim 10, which further comprises a shield unit disposed on one side of the coil, and a cooling system disposed outside the housing and directly or indirectly connected to the heat transfer unit.

13. A transportation means, which comprises:
a wireless charging device, wherein the wireless charging device comprises a coil unit; a magnetic unit disposed on the coil unit; and a heat transfer unit disposed in contact with at least a portion of the magnetic unit,
wherein at least a part of the heat transfer unit is inserted into the magnetic unit, and wherein the heat transfer unit is not disposed in a central region of the magnetic unit, and the coil unit is not disposed under the central region of the magnetic unit.

* * * * *